(12) United States Patent
Morris

(10) Patent No.: US 7,474,171 B2
(45) Date of Patent: Jan. 6, 2009

(54) METHOD AND APPARATUS FOR REDUCING DIELECTRIC CHARGING IN MEMS STRUCTURES

(75) Inventor: Francis J. Morris, Dallas, TX (US)

(73) Assignee: Raytheon Company, Waltham, MA (US)

( * ) Notice: Subject to any disclaimer, the term of this patent is extended or adjusted under 35 U.S.C. 154(b) by 317 days.

(21) Appl. No.: 11/143,410

(22) Filed: Jun. 1, 2005

(65) Prior Publication Data

US 2006/0276015 A1    Dec. 7, 2006

(51) Int. Cl.
*H01P 1/10*    (2006.01)
(52) U.S. Cl. ...................................... 333/101; 257/600
(58) Field of Classification Search ................. 333/101, 333/105, 258, 262; 257/415, 600, 602; 200/181
See application file for complete search history.

(56) References Cited

U.S. PATENT DOCUMENTS 7,214,995 B2 *   5/2007   Chou et al. .................. 257/415

FOREIGN PATENT DOCUMENTS

WO    WO 02/096796 A2    12/2002
WO    WO 03/078299 A1    9/2003

OTHER PUBLICATIONS

Chan, E.K., et al., "Comprehensive Static Characterization of Vertical Electrostatically Actuated Polysilicon Beams," IEEE Design & Test of Computers, XP-000920114, NSDOCID:<XP_920114A_1_>, 0740-7475/99, 8 pages, Oct.-Dec. 1999.
PCT, "Notification of Transmittal of the International Search Report and the Written Opinion of the International Searching Authority, or the Declaration," PCT/US2006/020013; 10 pages, date mailed Feb. 5, 2007.

* cited by examiner

*Primary Examiner*—David Vu
(74) *Attorney, Agent, or Firm*—Baker Botts L.L.P.

(57) ABSTRACT

A Micro-Electro-Mechanical system (MEMS) device includes a doped semiconductor layer that is disposed outwardly from a substrate. The MEMS device further includes an insulation layer that is disposed outwardly from and in contact with the doped semiconductor layer. The MEMS device also includes a conductive membrane that is disposed outwardly from the insulation layer by a distance that defines an air gap between the conductive membrane and the insulation layer. The conductive membrane is operable to come in contact with the insulation layer when an appropriate voltage is applied between the conductive membrane and the doped semiconductor layer. In one particular embodiment, the combination of the doped semiconductor layer and the insulation layer operates to provide a path to dissipate any excess electrical charge received by the insulation layer.

12 Claims, 2 Drawing Sheets

METHOD AND APPARATUS FOR REDUCING DIELECTRIC CHARGING IN MEMS STRUCTURES

FIELD OF INVENTION

The present invention relates generally to semiconductor devices and, more particularly, to a method and apparatus for reducing dielectric charging in Micro-Electro-Mechanical Systems (MEMS) structures.

BACKGROUND

Conventional Radio Frequency (RF) MEMS devices typically include a dielectric layer that is formed over a metal conductor and a conductive membrane that is separated from the metal conductor and the dielectric layer by an air gap. In operation, when an appropriate voltage is applied between the conductive membrane and the metal conductor, the conductive membrane moves towards the conductive layer and contacts the dielectric layer. Each time the device is operated and the conductive membrane contacts the dielectric layer an electrical charge is injected into and stored in the dielectric layer or on its surface. Over time, these electrical charges increase to a sufficient level and prevent the conductive membrane from retuning to its steady-state position after the voltage is removed. That is, the conductive membrane remains in contact with the dielectric layer when the voltage is removed between the conductive membrane and the metal conductor, and the MEMS device fails.

SUMMARY OF THE EXAMPLE EMBODIMENTS

In one example embodiment, a semiconductor device comprises a doped semiconductor layer that is disposed outwardly from a substrate. The semiconductor device further comprises an insulation layer that is disposed outwardly from and in contact with the doped semiconductor layer. The semiconductor device also comprises a conductive membrane that is disposed outwardly from the insulation layer by a distance that defines an air gap between the conductive membrane and the insulation layer. The conductive membrane is operable to contact the insulation layer when an appropriate voltage is applied between the conductive membrane and the doped semiconductor layer. In one particular embodiment, the combination of the doped semiconductor layer and the insulation layer operates to provide a path to dissipate any excess electrical charge received by the insulation layer.

Depending on the specific features implemented, particular embodiments of the present invention may exhibit some, none, or all of the following technical advantages. Various embodiments may be capable of reducing and/or minimizing dielectric charging associated with RF MEMS devices. Some embodiments may be capable of improving and/or simplifying the manufacturing process for MEMS devices. Other technical advantages will be readily apparent to one skilled in the art from the following figures, description and claims. Moreover, while specific advantages have been enumerated, various embodiments may include all, some or none of the enumerated advantages.

BRIEF DESCRIPTION OF THE DRAWINGS

For a more complete understanding of the present invention and its features and advantages, reference is now made to the following description, taken in conjunction with the accompanying drawings, in which like reference numerals refer to like elements, and wherein.

DETAILED DESCRIPTION OF THE INVENTION

Figure 1:
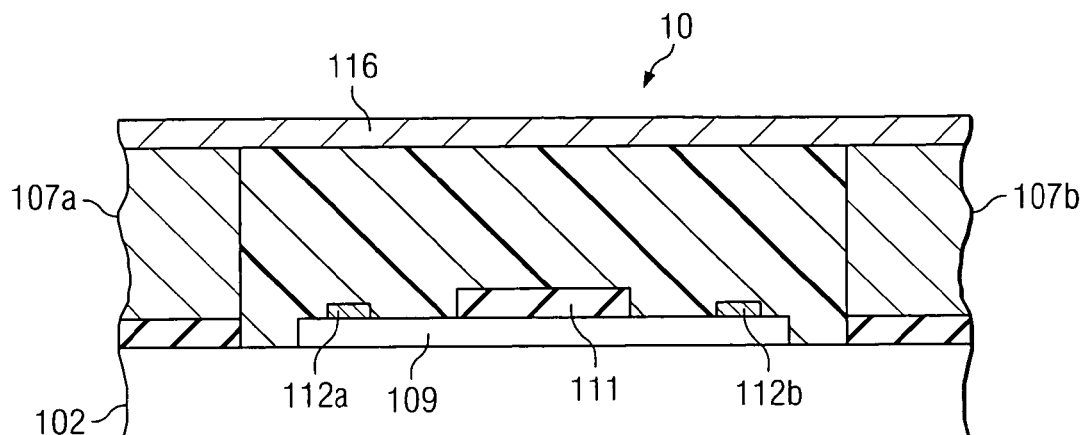
FIG. 1 is a cross sectional view of a portion of a Micro-Electro-Mechanical system (MEMS) device.

FIG. 1 is a cross sectional view of a portion of a Micro-Electro-Mechanical system (MEMS) device 10 capable of reducing and/or minimizing dielectric charging in MEMS structures. MEMS device 10 typically resides on a semiconductor substrate 102 and may be used as a basis for forming any of a number of semiconductor based devices, such as, for example, a MEMS switch incorporated into an antenna, a communication module, a digital or Radio Frequency (RF) component, or a combination of these of other devices. In this example, MEMS device 10 includes a doped semiconductor layer 109 formed outwardly from semiconductor substrate 102. As used throughout this document, the term "doped semiconductor layer" refers to a semiconductor material that is doped to achieve a relatively high conductivity. In various embodiments, doped semiconductor layer 109 can comprise, for example, Indium Gallium Arsenide (InGaAs), Indium Phosphide (InP), Gallium Arsenide (GaAs), GaN, SiC, silicon, polysilicon, amorphous silicon, germanium, or any other appropriate material or combinations of materials.

In this particular embodiment, doped semiconductor layer 109 comprises a primarily negative-type (N-type) single crystal material. In one particular embodiment, doped semiconductor layer 109 comprises an N+ Indium Gallium Arsenide (InGaAs) material. In other embodiments, doped semiconductor layer 109 can comprise, for example, a primarily positive-type (P-type) single crystal material. In some embodiments, insulation layer 111 can comprise, for example, amorphous silicon, polysilicon, Indium Aluminum Arsenide (InAlAs), GaN, CiS, a single crystal semiconductor material, or any other suitable material.

MEMS device manufacturers can adjust the conductivity of doped semiconductor layer 109 by adjusting the doping concentration and/or thickness of layer 109. Adjusting the doping concentration and/or thickness of doped semiconductor layer 109 can allow MEMS device manufacturers to tailor MEMS device 10 to achieve a desired electrical property (e.g., conductance, resistance, RF impedance, or other property). In some cases, MEMS device manufacturers can maximize the conductivity of doped semiconductor layer 109 by doping layer 109 to approximately the solubility limit of the material used to form layer 109. For example, where doped semiconductor layer 109 comprises an InGaAs material, a MEMS device manufacturer could dope the InGaAs material with a silicon dopant to a concentration of approximately $1\times10^{19}$ ions per cubic centimeter ($cm^{-3}$) to enhance the conductivity of the InGaAs material. The conductivity of the doped semiconductor layer can be maximized by selecting an appropriate doping concentration and/or thickness of doped semiconductor layer 109.

MEMS device 10 also includes a dielectric layer 104 that is capable of functioning as an isolation structure within MEMS device 10. In this example, MEMS device 10 includes posts 107 that are capable of functioning as an electrical and/or RF conductor within MEMS device 10. In this particular embodiment, MEMS device 10 also includes ohmic contacts 112 that are operable to provide an electrical and/or RF contact within MEMS device 10. Although MEMS device 10 includes two ohmic contacts 112 in this example, any number of ohmic contacts may be used without departing from the scope of the present disclosure. Depending on the fabrication process and materials selected for MEMS device 10, device 10 may be constructed without any ohmic contacts 112.

MEMS device 10 further includes a conductive membrane 116 that is operable to change its position relative to doped semiconductor layer 109 depending on a voltage applied between conductive membrane 116 and layer 109. MEMS device manufacturers can adjust the voltage potential necessary to move conductive membrane 116 towards doped semiconductor layer 109 (e.g., pull down voltage) by adjusting the width, length, and/or thickness of membrane 116. In most cases, for a particular thickness, the larger the length and width of membrane 116 (e.g., the surface area of membrane 116), the lower the pull down voltage necessary to move membrane 116 towards doped semiconductor layer 109. In this particular embodiment, conductive membrane 116 comprises a width of approximately one-hundred microns (100 µm), a length of approximately one-hundred microns (100 µm), and a thickness of approximately three-tenths of a micron (0.3 µm). Although conductive membrane 116 comprises a surface area of approximately 10,000 µm² and a thickness of 0.3 µm, any other suitable dimensions can be used with departing from the scope of the present disclosure.

MEMS device 10 also includes an insulation layer 111 disposed outwardly from doped semiconductor layer 109. As used throughout this document, the term "insulation layer" refers to a substantially undoped or lightly doped semiconductor material. In this particular embodiment, the combination of the conductive membrane 116, insulation layer 111 and doped semiconductor layer 109 operates to form a Schottky barrier diode within MEMS device 10. Thus, the Schottky barrier diode can comprise a conductive membrane and a substantially undoped or lightly doped semiconductor (e.g., insulation layer 111) to heavily doped semiconductor (e.g., doped semiconductor layer 109) junction. Moreover, the substantially undoped or lightly doped semiconductor to heavily doped semiconductor junction includes rectifying characteristics that may be suitable for use as a diode. In this particular embodiment, insulation layer 111 comprises a substantially undoped or lightly doped N-type semiconductor material having a relatively large band gap. According to one particular embodiment, insulation layer 111 comprises an N-Indium Aluminum Arsenide (InAlAs) material. In other embodiments, insulation layer 111 can comprise, for example, a primarily positive-type (P-type) semiconductor material. In some embodiments, insulation layer 111 can comprise, for example, amorphous silicon, polysilicon, a single crystal material, or any other suitable semiconductor material.

MEMS device 10 includes an air gap between insulation layer 111 and conductive membrane 116. In this particular embodiment, MEMS device 10 operates in the reverse bias state to minimize current flowing through MEMS device 10. In other embodiments, MEMS device 10 can operate in the forward bias state. In operation, when an appropriate voltage (e.g., a pull down voltage) is applied between doped semiconductor layer 109 and conductive membrane 116, conductive membrane 116 moves toward doped semiconductor layer 109. Conductive membrane 116 continues to move toward doped semiconductor layer 109 until membrane 116 contacts insulation layer 111. When membrane 116 contacts insulation layer 111 a Schottky contact is formed between membrane 116 and insulation layer 111. Moreover, the contact between conductive membrane 116 and insulation layer 111 operates to form a depletion region within MEMS device 10 that is capable of functioning as a capacitor.

The breakdown voltage of the material selected for insulation layer 111 should be greater than the pull down voltage applied between conductive membrane 116 and doped semiconductor layer 109. Ensuring that the breakdown voltage of the material of insulation layer 111 is larger than the pull down voltage should minimize the potential for an electrical short to form between conductive membrane 116 and doped semiconductor layer 109. In various embodiments, the breakdown voltage can be adjusted through the selection of an appropriate material and/or by increasing the thickness of insulation layer 111. It should be noted that increasing the thickness of insulation layer 111 to increase its breakdown voltage can result in a reduction in the capacitance of the device. Thus, the breakdown voltage of insulation layer 111 can be increased and the capacitance of the device can be maximized by selecting an appropriate material for insulation layer 111. In one particular embodiment, insulation layer 111 comprises InAlAs having a thickness of one micron (1 µm). Although insulation layer 111 comprises InAlAs having a thickness of 1 µm in this example, any other suitable single crystal material and thickness can be used without departing from the scope of the present disclosure.

Operation of conventional RF MEMS devices eventually results in the conductive membrane failing to return to a steady-state position after removal of the voltage between the conductive membrane and a conductor. This failure mode of conventional RF MEMS devices results from an electrical charge being built up within a dielectric layer that is formed over the conductor. In operation, when an appropriate voltage is applied between the conductive membrane and the conductor, the conductive membrane moves towards the conductive layer and contacts the dielectric layer. Each time the conventional device is operated and the conductive membrane contacts the dielectric layer an electrical charge is injected into and stored within the dielectric layer or on its surface. Over time, the electrical charge within the dielectric layer increases and is eventually large enough to prevent the conductive membrane from retuning to the steady-state position when the voltage is removed. That is, the conductive membrane remains in contact with the dielectric layer when the voltage is removed between the conductive membrane and the metal conductor.

Unlike conventional RF MEMS devices, MEMS device 10 forms a Schottky barrier diode that includes the conductive membrane 116, the insulation layer 111 and doped semiconductor layer 109. The presence of insulation layer 111 and doped semiconductor layer 109, and the use of an appropriate material (e.g., a single crystal material, amorphous silicon, polysilicon, or other semiconductor material) for each of layers 109 and 111 allows MEMS device 10 to minimize and/or reduce the charging of the dielectric associated with conventional RF MEMS devices. In particular, by forming doped semiconductor layer 109 outwardly from substrate 102 and insulation layer 111 outwardly from doped semiconductor layer 109, MEMS device 10 can advantageously provide a path to dissipate any excess electrical charge received by insulation layer 111 through substrate 102.

FIGS. 2A through 2E are cross sectional views illustrating one example of a method of forming a portion of a Micro-Electro-Mechanical system (MEMS) device 100. In FIG. 2, elements that are substantially similar in structure and function to elements in FIG. 1 have the same reference numerals. Particular examples and dimensions specified throughout this document are intended for example purposes only, and are not intended to limit the scope of the present disclosure. Moreover, the illustration in FIGS. 2A through 2E are not intended to be to scale. Depending on the materials used to form MEMS device 100 and the fabrication processes employed, MEMS device 100 may be formed using any of a variety of processes. For example, MEMS device 100 can be formed using conventional silicon based semiconductor processes, conventional III-V semiconductor processes, or any other appropriate semiconductor processes.

Forming doped semiconductor layer 109 outwardly from substrate 102 and insulation layer 111 outwardly from doped semiconductor layer 109 can minimize and/or reduce the charging of the dielectric associated with conventional RF MEMS devices. Forming doped semiconductor layer 109 outwardly from substrate 102 and insulation layer 111 outwardly from doped semiconductor layer 109 can alleviate some of the problems conventionally associated with RF MEMS devices by providing a path to dissipate any excess electrical charge received by insulation layer 111 through substrate 102.

Figure 2A:
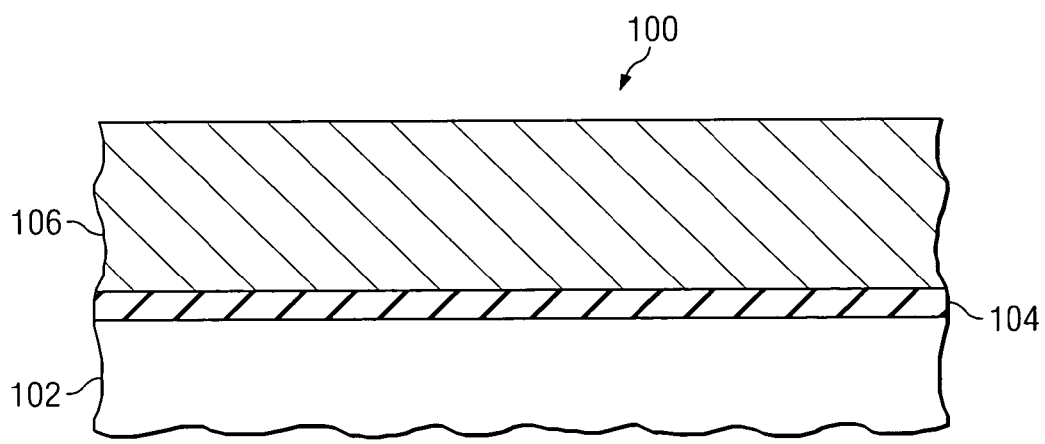
FIGS. 2A through 2F are cross sectional views illustrating one example of a method of forming a portion of a Micro-Electro-Mechanical system (MEMS) device.

FIG. 2A shows a cross sectional view of MEMS device 100 after formation of a first semiconductor layer 108 outwardly from a substrate 102 and after formation of a second semiconductor layer 110 outwardly from first semiconductor layer 108. Substrate 102 may comprise any suitable material used in semiconductor chip fabrication, such as indium phosphide, silicon, polysilicon, alumina, germanium, gallium, nitrogen, carbon, or a combination of these or any other semiconductor material. According to on particular embodiment, substrate 102 comprises indium phosphide. Although first semiconductor layer 108 and substrate 102 are shown as being formed without interstitial layers between them, such interstitial layers could alternatively be formed without departing from the scope of the present disclosure.

First semiconductor layer 108 may comprise, for example, Indium Gallium Arsenide (InGaAs), Indium Phosphide (InP), Gallium Arsenide (GaAs), GaN, SiC, or any other single crystal material. In other embodiments, first semiconductor layer 108 may comprise, for example, silicon, polysilicon, amorphous silicon, or germanium. Depending on the materials used to form first semiconductor layer 108 and the fabrication processes employed, first semiconductor layer 108 may be formed using any of a variety of processes. For example, in one exemplary embodiment first semiconductor layer 108 may be formed by depositing InGaAs. First semiconductor layer 108 may comprise any suitable thickness selected to accommodate a chosen or desired electrical property of MEMS device 100 (e.g., resistance). In this particular embodiment, first semiconductor layer 108 comprises a deposited thickness of approximately one micron (1 µm).

Second semiconductor layer 110 may comprise, for example, Indium Aluminum Arsenide (InAlAs), GaN, CiS, a single crystal semiconductor material, amorphous silicon, polysilicon, or any other suitable material. In this particular example, second semiconductor layer 110 comprises InAlAs. Although particular materials are illustrated, any other appropriate material may be used for semiconductor layer 108, semiconductor layer 110, and substrate 102 without departing from the scope of the present disclosure. Depending on the materials used to form second semiconductor layer 110 and the fabrication processes employed, second semiconductor layer 110 may be formed using any of a variety of processes. For example, in this particular embodiment second semiconductor layer 110 is formed by depositing InAlAs. Second semiconductor layer 110 may comprise any suitable thickness or material selected to accommodate a chosen or desired electrical property of MEMS device 100 (e.g., breakdown voltage). In this particular embodiment, second semiconductor layer 110 comprises a deposited thickness of approximately between one micron (1 µm) and two microns (2 µm).

Although first semiconductor layer 108 and second semiconductor layer 110 are shown as being formed without interstitial layers between them, such interstitial layers could alternatively be formed without departing from the scope of the present disclosure. In various embodiments, first semiconductor layer 108 can comprise a material that is selectively etchable from second semiconductor layer 110. That is, each of first semiconductor layer 108 and second semiconductor layer 110 can be removed using an etchant that does not significantly affect the other. In other embodiments, first semiconductor layer 108 can comprise a material that is incapable of being selectively etched from second semiconductor layer 110.

At some point, first semiconductor layer 108 can be doped to adjust the conductivity of first semiconductor layer 108. In various embodiments, first semiconductor layer 108 can be doped to form a doped semiconductor layer having a desired electrical property (e.g., conductance, resistance, RF impedance, or other property). In this particular embodiment, a heavily doped semiconductor layer having a primarily negative-type (N-type) implant is formed by introducing a silicon dopant as the InGaAs material of first semiconductor layer 108 is being deposited. In other embodiments, the doped semiconductor layer can have a primarily positive-type (P-type) implant and/or be formed through any of a variety of semiconductor manufacturing processes, such as, for example, by ion implantation. In one particular embodiment (not explicitly shown), a sacrificial dielectric layer may be disposed before formation of second semiconductor layer 110. In that case, the doped semiconductor layer is formed by implantation through the sacrificial dielectric layer. Then, the sacrificial dielectric layer is removed, and second semiconductor layer 110 is formed.

The conductivity of the doped semiconductor layer can be maximized by selecting an appropriate doping concentration and/or thickness of first semiconductor layer 108. In some cases, the doped semiconductor layer is formed by doping first semiconductor layer 108 to a concentration that accommodates a chosen or desired electrical property (e.g., resistance, RF impedance or other property) for MEMS device 100. In other cases, the doped semiconductor layer is formed by doping first semiconductor material to the solubility limit of the semiconductor material selected for first semiconductor layer 108. In this particular embodiment, the doped semiconductor layer is formed by doping the InGaAs material of first semiconductor layer 108 with a silicon dopant to a concentration of approximately $1 \times 10^{19}$ ions per cubic centimeter ($cm^{-3}$). In an alternative embodiment, the doped semiconductor layer is formed by doping a silicon material to a concentration of approximately $1 \times 10^{21}$ ions per cubic centimeter ($cm^{-3}$).

Figure 2B:
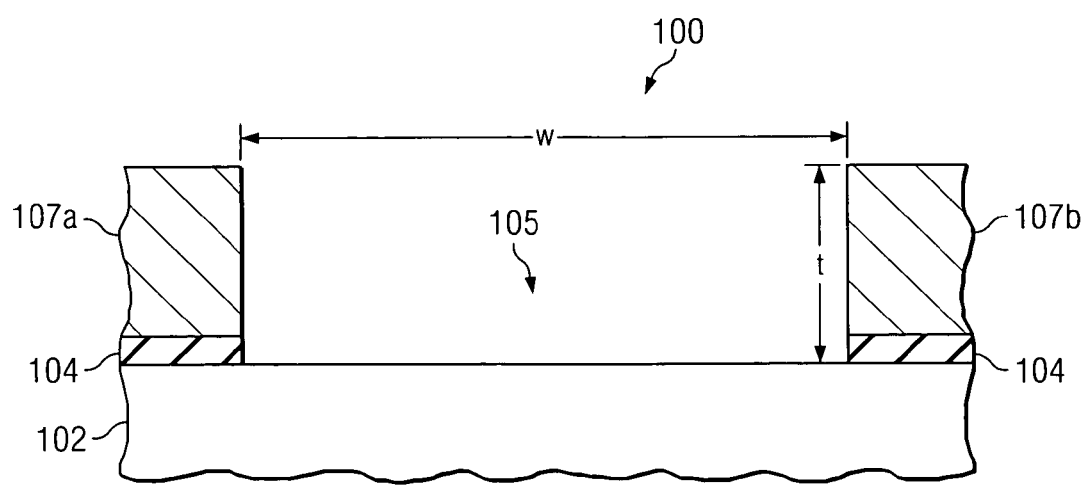

FIG. 2B shows a cross sectional view of MEMS device 100 after formation of a doped semiconductor layer 109 outwardly from substrate 102, after formation of an insulation layer 111 outward from doped semiconductor layer 109, and after formation of ohmic contacts 112 outwardly from and in contact with doped semiconductor layer 109. Forming doped semiconductor layer 109 and insulation layer 111 can be formed through any of a variety of semiconductor manufacturing processes. For example, doped semiconductor layer 109 and insulation layer 111 can be formed by patterning and etching first semiconductor layer 108 and second semiconductor layer 110.

Ohmic contacts 112 may comprise, for example, titanium, platinum, gold, aluminum, or a combination of these or other metals capable of providing an electrical contact to doped semiconductor layer 109. In other embodiments, contacts 112 may comprise, for example, silicon, polysilicon, silicide, and/ or a combination of these or other materials. Contacts 112 can be formed using any of a variety of processes, such as, for example, by depositing and/or bonding a combination of titanium, platinum, and gold onto layer 109. In this particular embodiment, two contacts 112a and 112b having a width, depth, and length are formed in contact with doped semiconductor layer 109. Although two contacts 112a and 112b are used in this example, any other number of contacts or configuration may be used without departing from the scope of the present disclosure. In an alternative embodiment, contacts 112 can be formed within doped semiconductor layer 109. In those embodiments, contacts 112 may be formed by an appropriate means. For example, doped semiconductor layer 109 or substrate 102 may be doped through ion implantation.

Figure 2C:
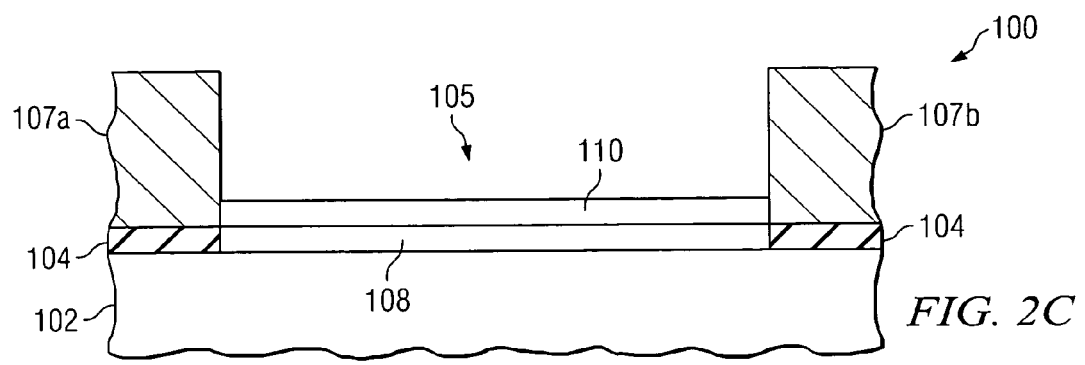

FIG. 2C shows a cross sectional view of MEMS device 100 after formation of a dielectric layer 104 outwardly from substrate 102, after formation of posts 107 outwardly from dielectric layer 104, and after formation of a void 105 outwardly from substrate 102 and within dielectric layer 104 and posts 107. Dielectric layer 104 may comprise, for example, nitride, oxide, silicon dioxide, oxi-nitride, or any other suitable material. Forming dielectric layer 104 may be affected through any of a variety of processes. In one non-limiting example, dielectric layer 104 can be formed by depositing and etching a nitride. In various embodiments, dielectric layer 104 can function as an isolation structure between a later formed membrane and doped semiconductor layer 109. Although substrate 102 and dielectric layer 104 are shown as being formed without interstitial layers between them, such interstitial layers could alternatively be formed without departing from the scope of the present disclosure.

Posts 107 may comprise, for example, gold, aluminum, copper, an aluminum alloy or a combination of these or other conductive materials. Where posts 107 comprise an aluminum alloy, the aluminum alloy may comprise, for example, aluminum, silicon, polysilicon, tungsten, nitride, and/or a combination of these or other conductive materials. In this particular example, posts 107 comprise gold. Forming posts 107 and void 105 may be affected through any of a variety of processes. For example, posts 107 and void 105 may be formed by depositing a conductive material outwardly from dielectric layer 104 and then removing substantially all of a portion of the conductive material and dielectric layer 104. In this particular embodiment, posts 107 and void 105 are formed by patterning and etching a deposited gold layer and a dielectric layer 104.

Posts 107 may comprise any suitable thickness that is selected to accommodate a chosen or desired electrical property of MEMS device 100. In this particular embodiment, each of posts 107 comprises a deposited thickness between three microns (3 μm) and four microns (4 μm). Although dielectric layer 104 and posts 107 are shown as being formed without interstitial layers between them, such interstitial layers could alternatively be formed without departing from the scope of the present disclosure.

Void 105 may comprise any dimensions selected to accommodate a chosen or desired electrical property for MEMS device 100. In this example, void 105 is formed by removing substantially all of a width (w) and a thickness (t) for a suitable length (not explicitly shown) associated with the portion of dielectric layer 104 and a deposited conductive material. In various embodiments, the width (w) and length may comprise, for example, between one-hundred microns (100 μm) and two-hundred microns (200 μm). In this particular embodiment, the dimensions selected for void 105 control the desired capacitance for MEMS device 100. That is, the dimensions selected for void 105 control the surface area of a later formed conductive membrane and at least a portion of the capacitance of MEMS device 100.

Figure 2D:
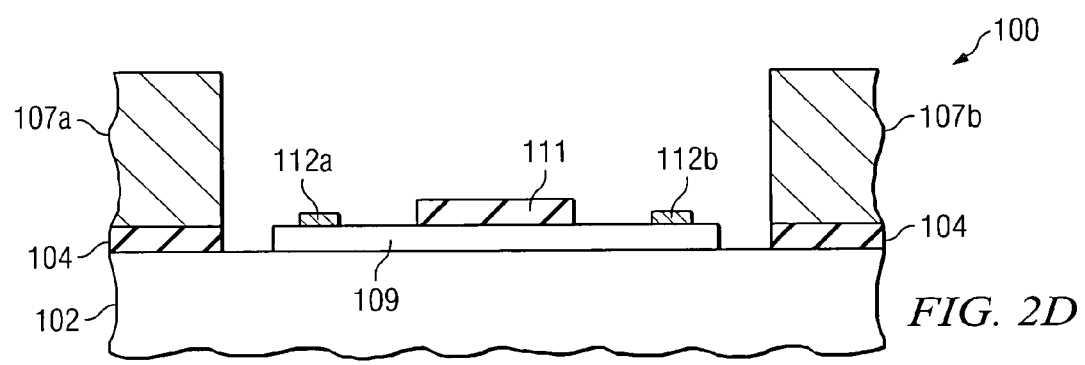

FIG. 2D shows a cross sectional view of MEMS device 100 after formation of a sacrificial layer 114 outwardly from substrate 102 and a conductive membrane 116 outwardly from sacrificial layer 114. Sacrificial layer 114 can comprise, for example, a photoresist material, an oxide, a nitride, oxi-nitride, or silicon oxide. In this example, sacrificial layer 114 comprises a material that is selectively etchable from both insulation layer 111 and doped semiconductor layer 109. That is, sacrificial layer 114 can be removed using an etchant or process that does not significantly affect either insulation layer 111 or doped semiconductor layer 109. Forming sacrificial layer 16 may be affected through any of a variety of processes. For example, first sacrificial layer 114 can be formed by depositing a photoresist material. Sacrificial layer 114 can be deposited to a depth that will eventually represent the spacing between insulation layer 111 and a conductive membrane. In this particular embodiment, this spacing defines an air gap of approximately four microns (4 μm).

Conductive membrane 116 can comprise for example, titanium, gold, aluminum, copper, tungsten, an aluminum alloy, or a combination of these or other conductive material. In this particular example, conductive membrane 116 comprises titanium tungsten. Forming conductive membrane 116 may be affected through any of a variety of processes. For example, conductive membrane 116 can be formed by placing titanium tungsten outwardly from sacrificial layer 114. Conductive membrane 116 may comprise any appropriate dimensions that are capable of accommodating a desired electrical property (e.g., pull down voltage) of MEMS device 100. In this particular embodiment, conductive membrane 116 comprises a deposited thickness of approximately three-thousand Angstroms (3,000 Å), a width of approximately one-hundred microns (100 μm), and a length of approximately one-hundred microns (100 μm).

Figure 2E:
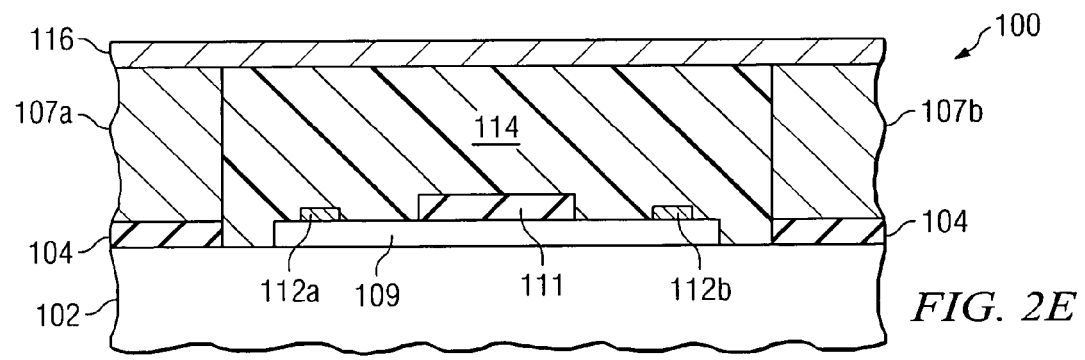
Figure 2F:
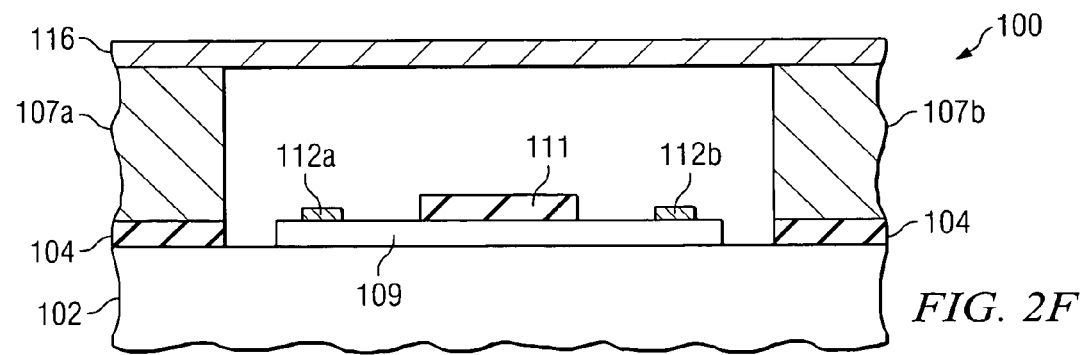

FIG. 2E shows a cross sectional view of MEMS device 100 after removal of sacrificial layer 114. Sacrificial layer 114 can be removed by any of a number of processes, such as, for example, by performing an etch or by performing an ashing process. Although this example illustrates the removal of sacrificial layer 114 after depositing conductive membrane 116 without any additional process steps, such additional process steps could alternatively be performed without departing from the scope of the present disclosure.

Although the present invention has been described in several embodiments, a myriad of changes, variations, alternations, transformations, and modifications may be suggested to one skilled in the art, and it is intended that the present invention encompass such changes, variations, alterations, alterations, transformations, and modifications as falling within the spirit and the scope of the appended claims.

What is claimed is:

1. A semiconductor device, comprising:
   a doped semiconductor layer disposed outwardly from a substrate;
   an insulation layer disposed outwardly from and in contact with the doped semiconductor layer, the doped semiconductor layer disposed between the substrate and the insulation layer; and
   a conductive membrane disposed outwardly from the insulation layer by a distance that defines an air gap between the conductive membrane and the insulation layer, the insulation layer disposed between the doped semiconductor layer and the conductive membrane, the conductive membrane operable to contact the insulation layer when an appropriate voltage is applied between the conductive membrane and the doped semiconductor layer, wherein the combination of the doped semiconductor layer and the insulation layer operates to provide a path to dissipate any excess electrical charge received by the insulation layer.

2. The semiconductor device of claim 1, wherein the doped semiconductor layer comprises a doping concentration that approximates a solubility limit of a material of the doped semiconductor layer.

3. The semiconductor device of claim 1, wherein the doped semiconductor layer comprises a single crystal material and wherein the single crystal material is selected from the group consisting of Indium Gallium Arsenide, Indium Phosphide, Gallium Arsenide, silicon, polysilicon, GaN, SiC, and germanium.

4. The semiconductor device of claim 1, wherein the insulation layer comprises a substantially undoped semiconductor material.

5. The semiconductor device of claim 1, wherein a breakdown voltage of a material of the insulation layer is greater than the appropriate voltage applied between the conductive membrane and the doped semiconductor layer.

6. The semiconductor device of claim 1, wherein the insulation layer comprises a semiconductor material and wherein the semiconductor material is selected from the group consisting of Indium Aluminum Arsenide, Aluminum Gallium Arsenide, amorphous silicon, polysilicon, and single crystal silicon.

7. The semiconductor device of claim 1, wherein the conductive membrane is capable of changing its position relative to the insulation layer depending on a voltage applied to the conductive membrane.

8. The semiconductor device of claim 1, further comprising one or more ohmic contacts disposed outwardly from and in contact with the doped semiconductor layer.

9. A semiconductor device comprising:
a doped semiconductor layer formed outwardly from a substrate, the doped semiconductor layer comprising a single crystal material, wherein the doped semiconductor layer comprises a doping concentration that approximates a solubility limit of the first single crystal material
an insulation layer disposed outwardly from the doped semiconductor layer, the doped semiconductor layer disposed between the substrate and the insulation layer, the insulation layer comprising a semiconductor material; and
a conductive membrane disposed outwardly from the insulation layer by a distance that defines an air gap between the conductive membrane and the insulation layer, the insulation layer disposed between the doped semiconductor layer and the conductive membrane, the conductive membrane operable to come in contact with the insulation layer when an appropriate voltage is applied between the conductive membrane and the doped semiconductor layer, wherein the combination of the conductive membrane, the doped semiconductor layer, and the insulation layer forms a Schottky barrier diode.

10. The semiconductor device of claim 9, wherein the combination of the doped semiconductor layer and the insulation layer operates to provide a path to dissipate any excess electrical charge received by the insulation layer.

11. The semiconductor device of claim 9, wherein the insulation layer comprises a substantially undoped semiconductor material.

12. The semiconductor device of claim 9, wherein a breakdown voltage of semiconductor material is greater than the appropriate voltage applied between the conductive membrane and the doped semiconductor layer.

* * * * *